US012645152B2

(12) United States Patent
Zach et al.

(10) Patent No.: US 12,645,152 B2
(45) **Date of Patent: *Jun. 2, 2026**

(54) SYSTEM AND METHOD FOR OPTIMIZING THROUGH SILICON VIA OVERLAY

(71) Applicant: KLA Corporation, Milpitas, CA (US)

(72) Inventors: Franz Zach, Los Gatos, CA (US);
Mark D. Smith, San Jose, CA (US);
Roel Gronheid, Leuven (BE)

(73) Assignee: KLA Corporation, Milpitas, CA (US)

( * ) Notice: Subject to any disclaimer, the term of this patent is extended or adjusted under 35 U.S.C. 154(b) by 362 days.

This patent is subject to a terminal disclaimer.

(21) Appl. No.: 17/589,630

(22) Filed: Jan. 31, 2022

(65) Prior Publication Data

US 2023/0030116 A1     Feb. 2, 2023

Related U.S. Application Data

(60) Provisional application No. 63/226,647, filed on Jul. 28, 2021.

(51) Int. Cl.
*G03F 7/00* (2006.01)
*H01L 21/67* (2006.01)

(52) U.S. Cl.
CPC ...... *G03F 7/70516* (2013.01); *G03F 7/70633* (2013.01); *H01L 21/67092* (2013.01); *H01L 21/67121* (2013.01); *H01L 21/67288* (2013.01)

(58) Field of Classification Search
CPC ............. G03F 7/70516; G03F 7/70633; H01L 21/67092; H01L 21/67121;
(Continued)

(56) References Cited

U.S. PATENT DOCUMENTS

| | | | |
|---|---|---|---|
| 5,202,748 A | 4/1993 | MacDonald et al. | |
| 6,064,486 A | 5/2000 | Chen et al. | |
| (Continued) | | | |

FOREIGN PATENT DOCUMENTS

| | | | |
|---|---|---|---|
| CA | 2334388 A1 | 10/2000 | |
| CN | 100552908 C | 10/2009 | |
| (Continued) | | | |

OTHER PUBLICATIONS

U.S. Appl. No. 17/161,369, filed Jan. 28, 2021, Zach et al.
(Continued)

*Primary Examiner* — Hung V Nguyen
(74) *Attorney, Agent, or Firm* — Suiter Swantz IP

(57) ABSTRACT

A wafer shape metrology system includes a wafer shape metrology sub-system configured to perform stress-free shape measurements on an active wafer, a carrier wafer, and a bonded device wafer. The active wafer includes functioning logic circuitry and the carrier wafer is electrically passive. The wafer shape metrology system includes a controller communicatively coupled to the wafer shape metrology sub-system. The controller is configured to receive stress-free shape measurements; determine overlay distortion between features on the active wafer and the carrier wafer; and convert the overlay distortion to a feed-forward correction for one or more lithographic scanners. The controller is also configured to determine a control range for a bonder or lithography scanner; predict an overlay distortion pattern; calculate an optimal control signature based on a minimal achievable overlay; and provide a feed-forward correction to the bonder or lithography scanner based on the calculated optimal control signature.

16 Claims, 7 Drawing Sheets

(58) Field of Classification Search

CPC ......... H01L 21/67288; H01L 21/67069; H01L 21/67253; H01L 21/67225; H01L 21/67219

See application file for complete search history.

(56) References Cited

U.S. PATENT DOCUMENTS

| | | | |
|---|---|---|---|
| 6,238,939 | B1 | 5/2001 | Wachs et al. |
| 6,335,791 | B1 | 1/2002 | Miyatake |
| 6,600,565 | B1 | 7/2003 | Suresh et al. |
| 6,762,846 | B1 | 7/2004 | Poris |
| 6,847,458 | B2 | 1/2005 | Freischlad et al. |
| 7,056,751 | B2 | 6/2006 | Faris |
| 7,079,257 | B1 | 7/2006 | Kirkpatrick et al. |
| 7,433,051 | B2 | 10/2008 | Owen |
| 7,570,796 | B2 | 8/2009 | Zafar et al. |
| 7,676,077 | B2 | 3/2010 | Kulkarni et al. |
| 7,875,528 | B2 | 1/2011 | La Tulipe, Jr. et al. |
| 8,163,570 | B2 | 4/2012 | Castex et al. |
| 8,394,719 | B2 | 3/2013 | Tsen et al. |
| 8,475,612 | B2 | 7/2013 | Gaudin |
| 8,575,002 | B2 | 11/2013 | Broekaart et al. |
| 8,640,548 | B2 | 2/2014 | Wimplinger |
| 8,703,368 | B2 | 4/2014 | Lee et al. |
| 8,768,665 | B2 | 7/2014 | Veeraraghavan et al. |
| 8,769,453 | B2 | 7/2014 | Scheffer et al. |
| 8,859,335 | B2 | 10/2014 | Lee et al. |
| 8,892,237 | B2 | 11/2014 | Vaid et al. |
| 8,900,885 | B1 | 12/2014 | Hubbard et al. |
| 8,949,057 | B1 | 2/2015 | Seong et al. |
| 9,087,176 | B1 | 7/2015 | Chang et al. |
| 9,116,442 | B2 | 8/2015 | Adel et al. |
| 9,121,684 | B2 | 9/2015 | Tang et al. |
| 9,312,161 | B2 | 4/2016 | Wimplinger et al. |
| 9,354,526 | B2 | 5/2016 | Vukkadala et al. |
| 9,466,538 | B1 | 10/2016 | Skordas et al. |
| 9,733,075 | B2 | 8/2017 | Broekaart et al. |
| 9,779,202 | B2 | 10/2017 | Vukkadala et al. |
| 9,852,972 | B2 | 12/2017 | Seddon et al. |
| 9,915,625 | B2 | 3/2018 | Gao et al. |
| 9,935,022 | B2 | 4/2018 | Owen |
| 10,024,654 | B2 | 7/2018 | Smith et al. |
| 10,234,772 | B2 | 3/2019 | Bangar et al. |
| 10,249,523 | B2 | 4/2019 | Vukkadala et al. |
| 10,267,746 | B2 | 4/2019 | Duffy et al. |
| 10,325,798 | B2 | 6/2019 | Wimplinger et al. |
| 10,401,279 | B2 | 9/2019 | Vukkadala et al. |
| 10,622,233 | B2 | 4/2020 | Hooge et al. |
| 10,649,447 | B2 * | 5/2020 | Izikson ............. H01L 21/67288 |
| 10,788,759 | B2 | 9/2020 | Tsai et al. |
| 10,886,256 | B2 | 1/2021 | Guo |
| 11,289,422 | B2 | 3/2022 | Yan et al. |
| 11,335,607 | B2 * | 5/2022 | Ip ............................ H01L 22/12 |
| 11,393,118 | B2 * | 7/2022 | Agarwal .............. G01B 11/306 |
| 11,710,649 | B2 | 7/2023 | Mizuta |
| 11,768,441 | B2 | 9/2023 | Berge et al. |
| 11,782,411 | B2 | 10/2023 | Zach et al. |
| 11,829,077 | B2 | 11/2023 | Zach et al. |
| 12,164,277 | B2 * | 12/2024 | Zach .................... H01L 21/681 |
| 12,197,137 | B2 | 1/2025 | Zach et al. |
| 2002/0071112 | A1 | 6/2002 | Smith et al. |
| 2002/0105649 | A1 | 8/2002 | Smith et al. |
| 2004/0023466 | A1 | 2/2004 | Yamauchi |
| 2004/0075825 | A1 | 4/2004 | Suresh et al. |
| 2005/0066739 | A1 | 3/2005 | Gotkis et al. |
| 2005/0087578 | A1 | 4/2005 | Jackson |
| 2005/0147902 | A1 | 7/2005 | Schaar et al. |
| 2005/0254030 | A1 | 11/2005 | Tolsma et al. |
| 2005/0271955 | A1 | 12/2005 | Cherala et al. |
| 2006/0141743 | A1 | 6/2006 | Best et al. |
| 2006/0170934 | A1 | 8/2006 | Picciotto et al. |
| 2006/0216025 | A1 | 9/2006 | Kihara et al. |
| 2007/0037318 | A1 | 2/2007 | Kim |
| 2007/0064243 | A1 | 3/2007 | Yunus et al. |
| 2007/0212856 | A1 | 9/2007 | Owen |

| | | | |
|---|---|---|---|
| 2007/0242271 | A1 | 10/2007 | Moon |
| 2008/0030701 | A1 | 2/2008 | Lof |
| 2008/0057418 | A1 | 3/2008 | Seltmann et al. |
| 2008/0106714 | A1 | 5/2008 | Okita |
| 2008/0182344 | A1 | 7/2008 | Mueller et al. |
| 2008/0188036 | A1 | 8/2008 | Tulipe et al. |
| 2008/0199978 | A1 | 8/2008 | Fu et al. |
| 2008/0316442 | A1 | 12/2008 | Adel et al. |
| 2010/0102470 | A1 | 4/2010 | Mokaberi |
| 2011/0172982 | A1 | 7/2011 | Veeraraghavan et al. |
| 2011/0210104 | A1 | 9/2011 | Wahlsten et al. |
| 2011/0265578 | A1 | 11/2011 | Johnson et al. |
| 2012/0006463 | A1 | 1/2012 | Gaudin |
| 2012/0255365 | A1 | 10/2012 | Wimplinger |
| 2012/0257207 | A1 | 10/2012 | Marx et al. |
| 2013/0054154 | A1 | 2/2013 | Broekaart et al. |
| 2013/0286395 | A1 | 10/2013 | Lee et al. |
| 2014/0057450 | A1 | 2/2014 | Bourbina et al. |
| 2014/0102221 | A1 | 4/2014 | Rebhan et al. |
| 2014/0209230 | A1 | 7/2014 | Wagenleitner |
| 2015/0044786 | A1 | 2/2015 | Huang et al. |
| 2015/0120216 | A1 | 4/2015 | Vukkadala et al. |
| 2015/0279709 | A1 | 10/2015 | La Tulipe et al. |
| 2016/0005662 | A1 | 1/2016 | Yieh et al. |
| 2016/0172254 | A1 | 6/2016 | Wimplinger |
| 2017/0162456 | A1 | 6/2017 | Owen |
| 2017/0221856 | A1 | 8/2017 | Yamauchi |
| 2017/0243853 | A1 | 8/2017 | Huang et al. |
| 2018/0165404 | A1 | 6/2018 | Eyring et al. |
| 2018/0342410 | A1 | 11/2018 | Hooge et al. |
| 2019/0122915 | A1 | 4/2019 | Mitsuishi et al. |
| 2019/0148184 | A1 | 5/2019 | Sugaya et al. |
| 2019/0206711 | A1 | 7/2019 | Wimplinger et al. |
| 2019/0257647 | A1 | 8/2019 | Ichinose et al. |
| 2019/0271542 | A1 | 9/2019 | Shchegrov et al. |
| 2019/0287854 | A1 | 9/2019 | Miller et al. |
| 2019/0353582 | A1 | 11/2019 | Vukkadala et al. |
| 2020/0018709 | A1 | 1/2020 | Hosler et al. |
| 2020/0091015 | A1 | 3/2020 | Sugaya et al. |
| 2020/0328060 | A1 | 10/2020 | Iizuka |
| 2021/0296147 | A1 | 9/2021 | Mizuta |
| 2022/0034823 | A1 | 2/2022 | Ono et al. |
| 2022/0187718 | A1 | 6/2022 | Zach et al. |
| 2022/0230099 | A1 | 7/2022 | Pandith et al. |
| 2022/0344282 | A1 | 10/2022 | Subrahmanyan et al. |
| 2023/0030116 | A1 | 2/2023 | Zach et al. |
| 2023/0032406 | A1 | 2/2023 | Zach et al. |
| 2023/0035201 | A1 | 2/2023 | Zach et al. |
| 2024/0094642 | A1 | 3/2024 | Zach et al. |

FOREIGN PATENT DOCUMENTS

| | | | |
|---|---|---|---|
| CN | 100562784 | C | 11/2009 |
| CN | 101727011 | A | 6/2010 |
| CN | 103378067 | A | 10/2013 |
| CN | 102656678 | B | 4/2015 |
| CN | 104977816 | A | 10/2015 |
| CN | 103283000 | B | 10/2016 |
| CN | 106547171 | A | 3/2017 |
| CN | 104658950 | B | 1/2018 |
| CN | 109451761 | A | 3/2019 |
| CN | 106887399 | B | 2/2020 |
| CN | 109891563 | B | 2/2021 |
| CN | 114361014 | A | 4/2022 |
| EP | 1829130 | A1 | 9/2007 |
| EP | 2299472 | A1 | 3/2011 |
| EP | 2463892 | B1 | 4/2013 |
| EP | 2656378 | B1 | 3/2015 |
| EP | 2863421 | A1 | 4/2015 |
| EP | 1829130 | B1 | 7/2016 |
| EP | 2854157 | B1 | 1/2019 |
| EP | 3460833 | A1 | 3/2019 |
| GB | 2462734 | B | 5/2010 |
| JP | H11135413 | A | 5/1999 |
| JP | H11176749 | A | 7/1999 |
| JP | 2001068429 | A | 3/2001 |
| JP | 2001077012 | A | 3/2001 |
| JP | 2002118052 | A | 4/2002 |
| JP | 2002229044 | | 9/2005 |

(56) References Cited

FOREIGN PATENT DOCUMENTS

| JP | 2005233928 | A | 9/2005 |
|----|----|----|----|
| JP | 2005251972 | A | 9/2005 |
| JP | 2006186377 | A | 7/2006 |
| JP | 2007158200 | A | 6/2007 |
| JP | 2007173526 | A | 7/2007 |
| JP | 2009113312 | A | 5/2009 |
| JP | 2009529785 | A | 8/2009 |
| JP | 2009239095 | A | 10/2009 |
| JP | 2009294001 | B | 12/2009 |
| JP | 2010529659 | A | 8/2010 |
| JP | 2010272707 | A | 12/2010 |
| JP | 5611371 | B2 | 10/2014 |
| JP | 6279324 | B2 | 2/2018 |
| JP | 2018036317 | A | 3/2018 |
| JP | 2020021076 | A | 2/2020 |
| JP | 2022098312 | A | 7/2022 |
| KR | 20040014686 | A | 2/2004 |
| KR | 20040046696 | A | 6/2004 |
| KR | 100914446 | B1 | 8/2009 |
| KR | 20090099871 | A | 9/2009 |
| KR | 101313909 | B1 | 10/2013 |
| KR | 20140069352 | A | 6/2014 |
| KR | 101801409 | B1 | 12/2017 |
| KR | 101849443 | B1 | 4/2018 |
| KR | 101866622 | B1 | 6/2018 |
| KR | 101866719 | B1 | 6/2018 |
| KR | 20180065033 | A | 6/2018 |
| KR | 102161093 | B1 | 9/2020 |
| SG | 181435 | A1 | 7/2012 |
| SG | 187694 | A1 | 3/2013 |
| TW | 200421422 | A | 10/2004 |
| TW | 201322353 | A | 6/2013 |
| TW | I447842 | B | 8/2014 |
| TW | 201532165 | A | 8/2015 |
| TW | 201630217 | A | 8/2016 |
| TW | I563548 | B | 12/2016 |
| TW | I563549 | B | 12/2016 |
| TW | I618130 | B | 3/2018 |
| TW | 201946099 | A | 12/2019 |
| TW | I680506 | B | 12/2019 |
| TW | 202127649 | A | 7/2021 |
| WO | 2005067046 | A1 | 7/2005 |
| WO | 2009113312 | A1 | 9/2009 |
| WO | 2012079786 | A1 | 6/2012 |
| WO | 2012083978 | A1 | 6/2012 |
| WO | 2012126752 | A1 | 9/2012 |
| WO | 2012135513 | A1 | 10/2012 |
| WO | 2013158039 | A3 | 6/2016 |
| WO | 2017217431 | A1 | 12/2017 |
| WO | 2018012300 | A1 | 1/2018 |
| WO | 2018071716 | A1 | 4/2018 |
| WO | 2019146427 | A1 | 8/2019 |
| WO | 2020045158 | A1 | 3/2020 |
| WO | 2020226152 | A1 | 11/2020 |
| WO | 2021106527 | A1 | 6/2021 |
| WO | 2022125343 | A1 | 6/2022 |

OTHER PUBLICATIONS

U.S. Appl. No. 17/563,477, filed Jan. 28, 2021, Zach et al.

Aitken et al., (2006). Discussion of tooling solutions for the direct bonding of silicon wafers. Microsystem Technologies. 12. 413-417. 10.1007/s00542-005-0028-4.

Aitken et al., "Glass-Glass Wafer Bonding for Microfluidic Devices." Proceedings of the 2008 Second International Conference on Integration and Commercialization of Micro and Nanosystems. 2008 Second International Conference on Integration and Commercialization of Micro and Nanosystems. Clear Water Bay, Kowloon, Hong Kong. Jun. 3-5, 2008. pp. 529-533. ASME. https://doi.org/10.1115/MicroNano2008-70293.

Asundi et al., "Rapid Defect Detections of Bonded Wafer Using Near Infrared Polariscope", Nanyang Technological University Singapore2011, Retrieved From.

Burns J. et al. (2008) An SOI-Based 3D Circuit Integration Technology. In: Tan C., Gutmann R., Reif L. (eds) Wafer Level 3-D ICs Process Technology. Integrated Circuits and Systems. Springer, Boston, MA. https://doi.org/10.1007/978-0-387-76534-1_8.

Burns, J.A., et al., "A wafer-scale 3-D circuit integration technology," in IEEE Transactions on Electron Devices, vol. 53, No. 10, pp. 2507-2516, Oct. 2006, doi: 10.1109/TED.2006.882043.

Byelyayev, Anton, "Stress diagnostics and crack detection in full-size silicon wafers using resonance ultrasonic vibrations" (2005). Graduate Theses and Dissertations.http://scholarcommons.usf.edu/etd/2969.

Chen, Kuan-Neng (2005). Copper Wafer Bonding in Three-Dimensional Integration [Unpublished Doctoral thesis] Massachusetts Institute of Technology.

Choi et al., (2005). Distortion and overlay performance of UV step and repeat imprint lithography. Microelectronic Engineering. 78-79. 633-640. 10.1016/j.mee.2004.12.097.

De Wolf, "Raman Spectroscopy: About Chips and Stress", Ramanspectroscopy, Imec, Kapeldreef 75, B-3001 Leuven, Belgium 2003.

Di Cioccio, L. et al., "Direct bonding for wafer level 3D integration," 2010 IEEE International Conference on Integrated Circuit Design and Technology, 2010, pp. 110-113, doi: 10.1109/ICICDT.2010.5510276.

Garnier, A. et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.

Gegenwarth et al., "Effect Of Plastic Deformation Of Silicon Wafers On Overlay", Proc. SPIE 0100, Developments in Semiconductor Microlithography II, (Aug. 8, 1977); https://doi.org/10.1117/12.955355.

Hanna et al., (1999). Numerical and experimental study of the evolution of stresses in flip chip assemblies during assembly and thermal cycling. 1001-1009. 10.1109/ECTC.1999.776308.

Horn et al., (2008). Detection and Quantification of Surface Nanotopography-Induced Residual Stress Fields in Wafer-Bonded Silicon. Journal of The Electrochemical Society. 155. H36-H42. 10.1149/1.2799880.

Huston, et al., (2004). Active membrane masks for improved overlay performance in proximity lithography. Proc SPIE. 5388. 11-19. 10.1117/12.546598.

Lim, et al., "Warpage Modeling and Characterization to Simulate the Fabrication Process of Wafer-Level Adhesive Bonding," 2007 32nd IEEE/CPMT International Electronic Manufacturing Technology Symposium, 2007, pp. 298-302, doi: 10.1109/IEMT.2007.4417081.

Liu et al., Application of IVS Overlay Measurement to Wager Deformation Characterization Study (2004).

Meinhold et al., "Sensitive strain measurements of bonded SOI films using Moire/spl acute/," in IEEE Transactions on Semiconductor Manufacturing, vol. 17, No. 1, pp. 35-41, Feb. 2004, doi: 10.1109/TSM.2003.823259.

Nagarajan, R. (2009). Commercialization of low temperature copper thermocompression bonding for 3D integrated circuits. [unpublished Masters thesis] Massachusetts Institute of Technology.

Nagaswami et al., Overlay error components in double-patterning lithography, retrieved from Internet Sep. 2010.

Nagaswami, et al., "Double Patterning Lithography Overlay Components," 6th International Symp. on Immersion Lithography Extensions, Prague, Nov. 2009.

Raghunathan et al., "Correlation of overlay performance and reticle substrate non-flatness effects in EUV lithography", Proc. SPIE 7488, Photomask Technology 2009, 748816 (Sep. 30, 2009); https://doi.org/10.1117/12.834746.

Rudack et al., "IR microscopy as an early electrical yield indicator in bonded wafer pairs used for 3D integration," Proc. SPIE 7638, Metrology, Inspection, and Process Control for Microlithography XXIV, 763815 (Apr. 1, 2010); https://doi.org/10.1117/12.848400.

Schaper,et al., "Induced thermal stress fields for three-dimensional distortion control of Si wafer topography", *Review of Scientific Instruments*, vol. 75, No. 6, pp. 1997-2002, 2004. doi:10.1063/1.1753101.

(56) References Cited

OTHER PUBLICATIONS

Shetty, et al., "Impact of laser spike annealing dwell time on wafer stress and photolithography overlay errors," 2009 International Workshop on Junction Technology, 2009, pp. 119-122, doi: 10.1109/IWJT.2009.5166234.

Steen et al., (2007). Overlay as the key to drive wafer scale 3D integration. Microelectronic Engineering. 84. 1412-1415. 10.1016/j.mee.2007.01.231.

Tanaka, Tetsu et al., "3D LSI technology and reliability issues", Digest of Technical Papers—Symposium on VLSI Technology (2011).

Tupek, Michael et al., "Submicron aligned wafer bonding via capillary forces." Journal of Vacuum Science & Technology B 25 (2007): 1976-1981.

Turner et al., "Predicting distortions and overlay errors due to wafer deformation during chucking on lithography scanners," J. Micro/Nanolith. MEMS MOEMS 8(4) 043015 (Oct. 1, 2009) https://doi.org/10.1117/1.3247857.

Turner, K. T.et al., "Modeling of direct wafer bonding: Effect of wafer bow and etch patterns", Journal of Applied Physics, vol. 92, No. 12, pp. 7658-7666, 2002. doi:10.1063/1.1521792.

Y Gogotsi et al., "Raman Microspectroscopy Study of Processing-Induced Phase Transformations and Residual Stress in Silicon", Semiconductor Science and Technology, vol. 14, No. 10, Department of Mechanical Engineering, University of Illinois at Chicago, Chicago, IL, Mar. 4, 1999.

U.S. Appl. No. 17/589,516, filed Jan. 31, 2022, Franz Zach.

U.S. Appl. No. 17/589,704, filed Jan. 31, 2022, Franz Zach.

Aitken, et al. "Discussion of tooling solutions for the direct bonding of silicon wafers." Microsystem Technologies 12 (2006): 413-417.

Burns et al., "A wafer-scale 3-D circuit integration technology," in IEEE Transactions on Electron Devices, vol. 53, No. 10, pp. 2507-2516, Oct. 2006, doi: 10.1109/TED.2006.882043.

Chan, et al. "An approach for alignment, mounting, and integration of IXO mirror segments." Optical Engineering + Applications (2009).

Cotte, et al., "Film stress changes during anodic bonding of NGL masks," Proc. SPIE 3997, Emerging Lithographic Technologies IV, (Jul. 21, 2000); https://doi.org/10.1117/12.390089.

Feng, et al., (Jan. 14, 2007). "On the Stoney Formula for a Thin Film/Substrate System With Nonuniform Substrate Thickness." ASME. J. Appl. Mech. Nov. 2007; 74(6): 1276-1281. https://doi.org/10.1115/1.2745392.

Goyal, et al., "Solder bonding for microelectromechanical systems (MEMS) applications," Proc. SPIE 4980, Reliability, Testing, and Characterization of MEMS/MOEMS II, (Jan. 16, 2003); https://doi.org/10.1117/12.478202.

Tippur, Hareesh V.. "Simultaneous and real-time measurement of slope and curvature fringes in thin structures using shearing interferometery." Optical Engineering 43 (2004): 3014-3020.

Turner, et al., (2004). Mechanics of wafer bonding: Effect of clamping. Journal of Applied Physics. 95. 10.1063/1.1629776.

Turner, et al., "Mechanics of direct wafer bonding." Proceedings of the Royal Society A: Mathematical, Physical and Engineering Sciences 462 (2005): 171-188.

Search Report and Written Opinion in International Application No. PCT/US2022/038412 dated Nov. 16, 2022, 8 pages.

Korean Intellectual Property Office, International Search Report and Written Opinion for International Application No. PCT/US2023/032022, Dec. 28, 2023, 9 pages.

Burns, et al. "An SOI-based three-dimensional integrated circuit technology." 2000 IEEE International SOI Conference. Proceedings (Cat. No. 00CH37125) (2000): 20-21.

Chen, Kuan-Neng (2005). Copper Wafer Bonding in Three-Dimensional Integration [Published Doctoral thesis] Massachusetts Institute of Technology.

Choi, et al., Distortion and overlay performance of UV step and repeat imprint lithography, Microelectronic Engineering, vols. 78-79, 2005, pp. 633-640, ISSN 0167-9317, https://doi.org/10.1016/j.mee.2004.12.097.

Di Cioccio, et al., "Direct bonding for wafer level 3D integration," 2010 IEEE International Conference on Integrated Circuit Design and Technology, 2010, pp. 110-113, doi: 10.1109/ICICDT.2010.5510276.

Garnier, et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.

Hanna, et al., "Numerical and experimental study of the evolution of stresses in flip chip assemblies during assembly and thermal cycling," 1999 Proceedings. 49th Electronic Components and Technology Conference (Cat. No. 99CH36299), 1999, pp. 1001-1009, doi: 10.1109/ECTC.1999.776308.

International Search Report and Written Opinion in Application No. PCT/US2021/061310 dated Mar. 28, 2022, 8 pages.

Liu, et al., "Application of IVS Overlay Measurement to Wafer Deformation Characterization Study." (2004).

Meinhold, et al., (2004). Sensitive Strain Measurements of Bonded SOI Films Using Moiré. Semiconductor Manufacturing, IEEE Transactions on. 17. 35-41. 10.1109/TSM.2003.823259.

Nagarajan, R. (2008). Commercialization of low temperature copper thermocompression bonding for 3D integrated circuits. [Published Masters thesis] Massachusetts Institute of Technology.

Nagaswami, et al., "DPL Overlay Components," 6th International Symp. on Immersion Lithography Extensions, Prague, Nov. 2009.

Nagaswami, et al., (2010). Overlay error components in double-patterning lithography. Solid State Technology. 53. 26-28.

Raghunathan, et al., (2009). Correlation of overlay performance and reticle substrate non-flatness effects in EUV lithography. Proc SPIE. 7488. 10.1117/12.834746.

Rudack, et al., (2010). IR microscopy as an early electrical yield indicator in bonded wafer pairs used for 3D Integration. 10.1117/12.848400.

Search Report and Written Opinion in International Application No. PCT/US2022/036745 dated Nov. 9, 2022, 8 pages.

Search Report and Written Opinion in International Application No. PCT/US2022/037522 dated Nov. 9, 2022. 9 pages.

Steen, et al. "Overlay as the key to drive wafer scale 3D integration." Microelectronic Engineering 84 (2007): 1412-1415.

Tupek, et al., "Submicron aligned wafer bonding via capillary forces." Journal of Vacuum Science & Technology B 25 (2007): 1976-1981.

Turner, et al., (2002). Modeling of direct wafer bonding: Effect of wafer bow and etch patterns. Journal of Applied Physics. 92. 7658-7666. 10.1063/1.1521792.

Turner, Kevin T. et al. "Predicting distortions and overlay errors due to wafer deformation during chucking on lithography scanners." Journal of Micro-nanolithography Mems and Moems 8 (2009): 043015.

Turner, Kevin T., "Wafer-Bonding: Mechanics-Based Models and Experiments", Massachusetts Institute of Technology, May 2004, Thesis, 186 pages.

European Patent Office, Extended European Search Report received in EP Application No. 22850076.5, Feb. 20, 2025, 11 pages.

European Patent Office, Extended European Search Report received in EP Application No. 22850101.1, Mar. 5, 2025, 14 pages.

Sakanas et al., "Comparison of processing-induced deformations of InP bonded to Si determined by e-beam metrology: direct vs. adhesion bonding," Dec. 4, 2018, 7 pages.

Steen et al., "Overlay as the key to drive wafer scale 3D integration," Microelectronic Engineering, vol. 84, May 2007, 4 pages.

Taiwan Patent Office, Office Action received in TW Application No. 111121141, Nov. 25, 2024, 11 pages.

European Patent Office, Extended European Search Report received in EP Application No. 22850212.6, Jul. 2, 2025, 10 pages.

Taiwan Patent Office, Office Action received in TW Application No. 111121774, Jul. 30, 2025, 18 pages (including translation).

European Patent Office, Extended European Search Report received in EP Application No. 219041308, Sep. 17, 2024, 11 pages.

Japanese Patent Office, Office Action received in JP Application No. 2023-533686, Dec. 19, 2024, 15 pages (including translation).

Taiwan Patent Office, Office Action received in TW Application No. 110126925, Oct. 25, 2024, 8 pages (including translation).

(56) References Cited

OTHER PUBLICATIONS

Taiwan Patent Office, Taiwan Office Action for Application Number TW111128372 dated Jan. 5, 2026, 20 pages (with translation).

* cited by examiner

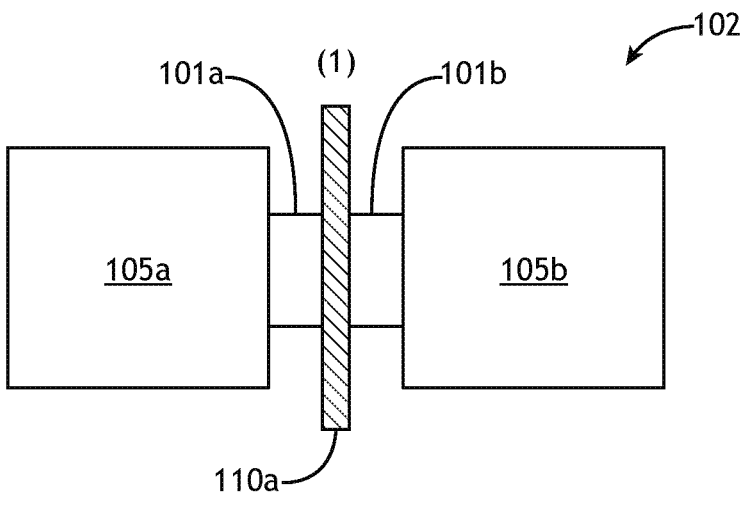
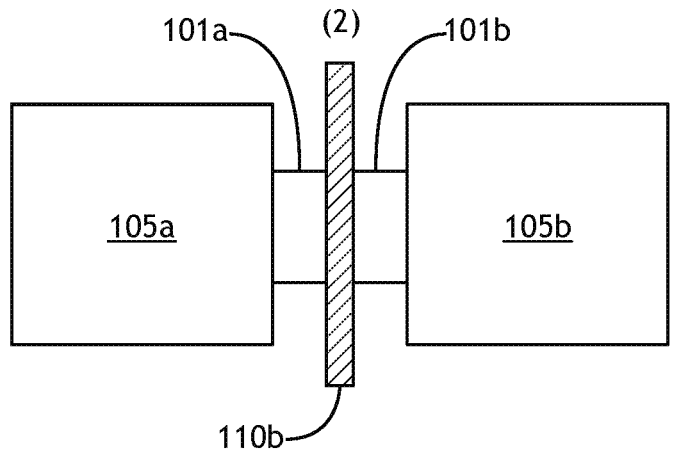
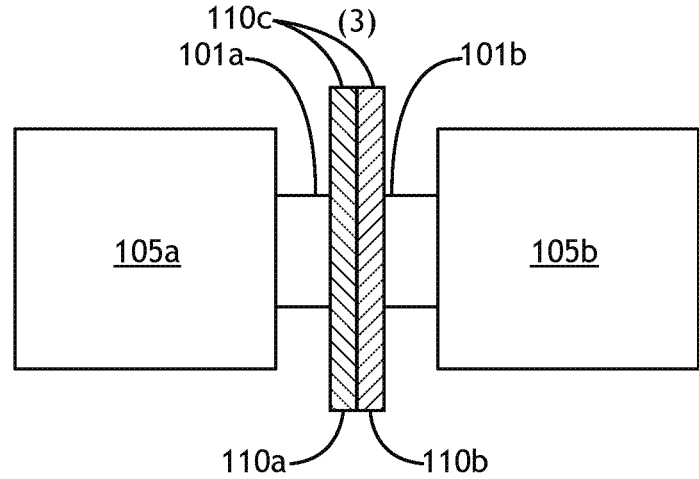
FIG.1B

200

202 PRE-BONDING METROLOGY

204 WAFER BONDING

206 POST-BONDING METROLOGY

208 WAFER GRINDING /THINNING

210 PATTERNED WAFER POST-GRINDING METROLOGY

212 ADDITIONAL PROCESSING

214 PRE-LITHOGRAPHY METROLOGY

216 FEED-FORWARD CORRECTIONS TO LITHOGRAPHY TOOL

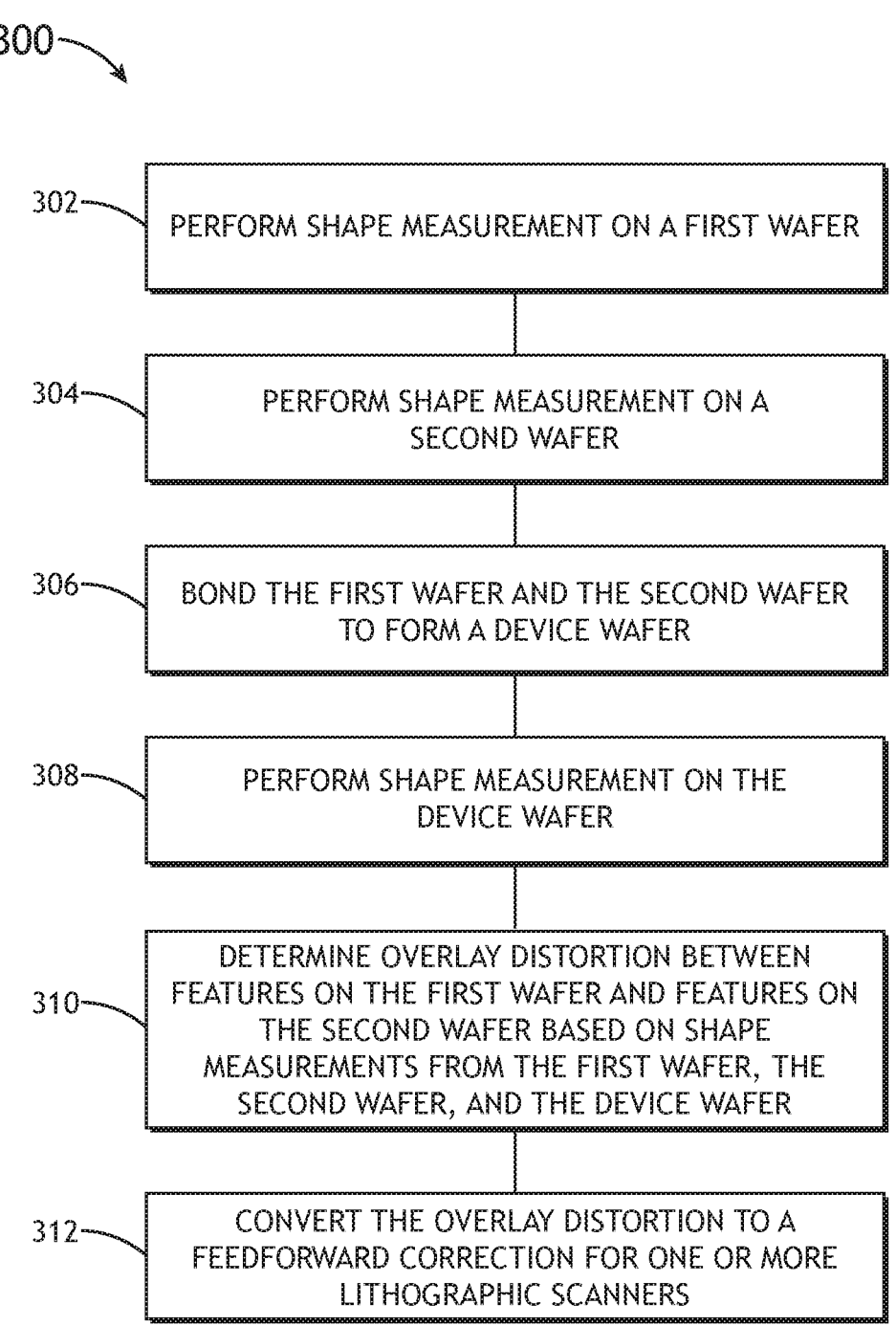

300

302 — PERFORM SHAPE MEASUREMENT ON A FIRST WAFER

304 — PERFORM SHAPE MEASUREMENT ON A SECOND WAFER

306 — BOND THE FIRST WAFER AND THE SECOND WAFER TO FORM A DEVICE WAFER

308 — PERFORM SHAPE MEASUREMENT ON THE DEVICE WAFER

310 — DETERMINE OVERLAY DISTORTION BETWEEN FEATURES ON THE FIRST WAFER AND FEATURES ON THE SECOND WAFER BASED ON SHAPE MEASUREMENTS FROM THE FIRST WAFER, THE SECOND WAFER, AND THE DEVICE WAFER

312 — CONVERT THE OVERLAY DISTORTION TO A FEEDFORWARD CORRECTION FOR ONE OR MORE LITHOGRAPHIC SCANNERS

FIG.3

GOLDEN SIGNATURE IDENTIFICATION AND OPTIMIZATION

OPTIMIZE GOLDEN SIGNATURE BASED ON LITHO CORRECTION

RESIDUAL OVERLAY AFTER LITHO CORRECTION FOR GOLDEN SIGNATURE RANGE

GOLDEN SIGNATURE RANGE

RESIDUAL OVERLAY

500

600

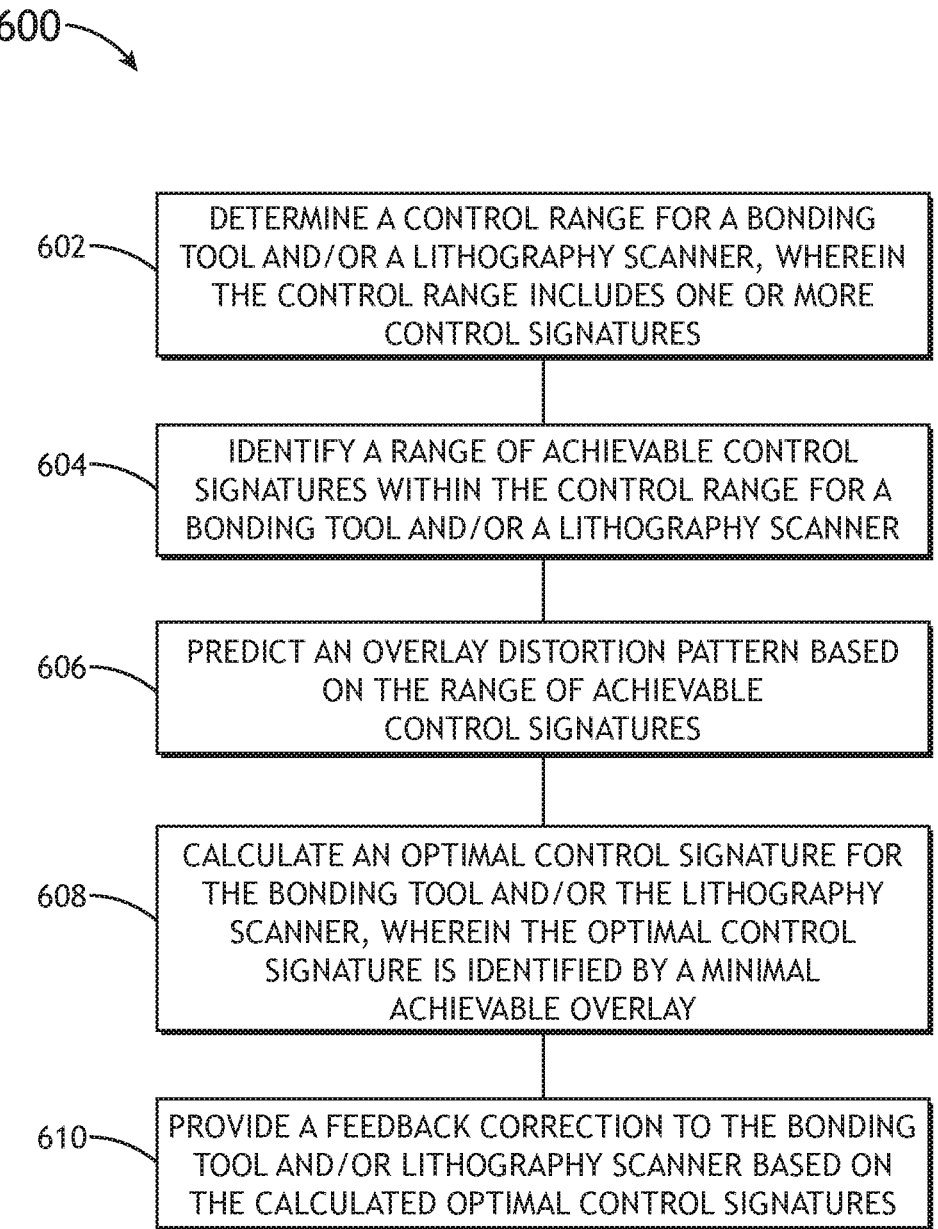

602 — DETERMINE A CONTROL RANGE FOR A BONDING TOOL AND/OR A LITHOGRAPHY SCANNER, WHEREIN THE CONTROL RANGE INCLUDES ONE OR MORE CONTROL SIGNATURES

604 — IDENTIFY A RANGE OF ACHIEVABLE CONTROL SIGNATURES WITHIN THE CONTROL RANGE FOR A BONDING TOOL AND/OR A LITHOGRAPHY SCANNER

606 — PREDICT AN OVERLAY DISTORTION PATTERN BASED ON THE RANGE OF ACHIEVABLE CONTROL SIGNATURES

608 — CALCULATE AN OPTIMAL CONTROL SIGNATURE FOR THE BONDING TOOL AND/OR THE LITHOGRAPHY SCANNER, WHEREIN THE OPTIMAL CONTROL SIGNATURE IS IDENTIFIED BY A MINIMAL ACHIEVABLE OVERLAY

610 — PROVIDE A FEEDBACK CORRECTION TO THE BONDING TOOL AND/OR LITHOGRAPHY SCANNER BASED ON THE CALCULATED OPTIMAL CONTROL SIGNATURES

FIG.6

SYSTEM AND METHOD FOR OPTIMIZING THROUGH SILICON VIA OVERLAY

CROSS-REFERENCE TO RELATED APPLICATION

The present application claims the benefit under 35 U.S.C. § 119(e) of U.S. Provisional Application Ser. No. 63/226,647, filed Jul. 28, 2021, which is incorporated herein by reference in the entirety.

TECHNICAL FIELD

The present disclosure relates generally to semiconductor wafer metrology and, more particularly, to a system and method for optimizing through silicon via overlay.

BACKGROUND

The expanding consumer electronics market is driving development of semiconductor innovation. The push for integration, reduction in power consumption, and the need for smaller form factors lead to new architectures which combine dissimilar technologies and creative packaging methods, where maximum functionality is packaged into minimal space. The use of buried power rails is believed to be a key enabler for shrinking logic ground rules. The buried power rails allow for a more direct connection between the front-end devices, the supply voltage, and the ground than is possible with a conventional back end of line process having a large number of metal layers. Bonding processes have typically been used which introduce bonding induced distortions with significantly larger overlay requirements. Through Silicon Vias (TSV's) have evolved as one of the key technologies for 3D integration and wafer level packaging. In general, performing TSV lithography overlay control includes multiple elements that are quite common to the lithography process control. Typically, a scanner alignment system is utilized which uses reference targets on the device layer and measures the position of the targets. The positions of the targets are typically interpolated with an alignment model that may include higher order terms (e.g., HOWA3 which uses $3^{rd}$ order terms in wafer coordinates). Also, an overlay correction on the scanner is made which typically includes a grid model as well as a correction by exposure method (CPE). Additionally, conventional overlay targets may be used to measure the overlay between the TSV lithography pattern and a reference layer on a device wafer. Further, a feedback control system may use information about model parameters from prior lots to generate a new set of corrections for the exposure of the next lot. Ideally a combination of bonder adjustments and scanner adjustments is used to achieve optimum distortions. Specifically, the challenge for the bonding induced distortions is that overlay targets are required with conventional overlay measurements.

The methodology described above may be disadvantageous for multiple reasons. First, achieving the proper correction accuracy requires a high density of metrology targets to capture all the bonding induced distortions. While some of the process induced distortions (both from bonding as well as post bonding processing) vary over the wafer in a relatively smooth fashion, there are signatures where distortions occur on a relatively short scale. These signatures are exemplified by distortions that are generated during the initiation of the bonding process in the center of the wafer. These signatures may occur over fairly short distances (i.e., over a distance of 20-30 mm). Characterization of these signatures requires a very high density of metrology targets. Placing such a high density of targets may not be feasible as these targets may interfere with the device pattern. The previous method requires extensive, and therefore, time consuming overlay metrology. It is therefore desirable to have an overlay metrology approach capable of generating dense distortion measurements without requiring overlay targets. For the purpose of detecting any shifts in the bonder induced distortions that may be detrimental for the lithography corrections, it is desirable to monitor the bonder performance as soon as the bonding has occurred. In the conventional approach, using infrared light to measure the overlay between features on the device and carrier wafer requires additional processing of the carrier wafer for the purpose of forming reference marks which would otherwise not be required. Finally, the standard approach typically uses a feedback control for the lithography scanner, which may not account for wafer-to-wafer variability (induced by differences between bonders). Thus, it would be desirable to provide a system and method that cure the shortfalls identified above.

SUMMARY

A wafer shape metrology system is disclosed, in accordance with one or more illustrative embodiments of the present disclosure. In one illustrative embodiment, the system includes a wafer shape metrology sub-system configured to perform one or more stress-free shape measurements on a first wafer, a second wafer, and a bonded device wafer, where the bonded device wafer comprises a post-bonding pair of the first wafer and the second wafer. In another illustrative embodiment, the system may include a controller communicatively coupled to the wafer shape metrology sub-system, the controller including one or more processors to: receive one or more stress-free shape measurements from the wafer shape sub-system; determine overlay distortion between one or more features on the first wafer and one or more features on the second wafer based on the one or more stress-free shape measurements of the first wafer, the second wafer, and the bonded device wafer; and convert the overlay distortion to a feed-forward correction for one or more lithographic scanners.

A system is disclosed, in accordance with one or more illustrative embodiments of the present disclosure. In one illustrative embodiment, the system includes a controller configured to receive one or more shape measurements from a wafer shape metrology sub-system. In another illustrative embodiment, the controller includes one or more processors configured to execute a set of program instructions stored in a memory. In another illustrative embodiment, the set of program instructions are configured to cause the one or more processors to: receive the one or more stress-free shape measurements from the wafer shape sub-system; determine overlay distortion between one or more features on the first wafer and one or more features on the second wafer based on the one or more stress-free shape measurements of the first wafer, the second wafer, and the bonded device wafer; and convert the overlay distortion to a feed-forward correction for one or more lithographic scanners.

A method of determining an optimal signature for a plurality of process tools is disclosed, in accordance with one or more illustrative embodiments of the present disclosure. In one illustrative embodiment, the method may include, but is not limited to, determining a control range for each process tool of the plurality of process tools, where the control range of each process tool of the plurality of process tools may include one or more signatures. In another illustrative embodiment, the method may include, but is not limited to, identifying a range of achievable signatures within the control range for each process tool of the plurality of process tools. In another illustrative embodiment, the method may include, but is not limited to, calculating an optimal signature for each process tool of the plurality of process tools, where the optimal signature is identified based on one or more additional optimization criteria. In another illustrative embodiment, the method may include, but is not limited to, predicting an overlay distortion pattern based on the optimal signatures calculated. In another illustrative embodiment, the method may include, but is not limited to, providing a feedback adjustment to the plurality of process tools based on the predicted overlay.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1B illustrates a conceptual view of the wafer shape metrology system performing wafer shape measurements on a first wafer, a second wafer, and a post bonded pair of wafers, in accordance with one or more embodiments of the present disclosure.

FIG. 3 illustrates a flow diagram depicting a method of converting an overlay distortion into a feedforward correction for a lithography tool, in accordance with one or more embodiments of the present disclosure.

FIG. 6 illustrates a flow diagram depicting a method of determining an optimal control signature for a bonding tool or a lithography tool, in accordance with one or more embodiments of the present disclosure.

DETAILED DESCRIPTION

Figure 1A:
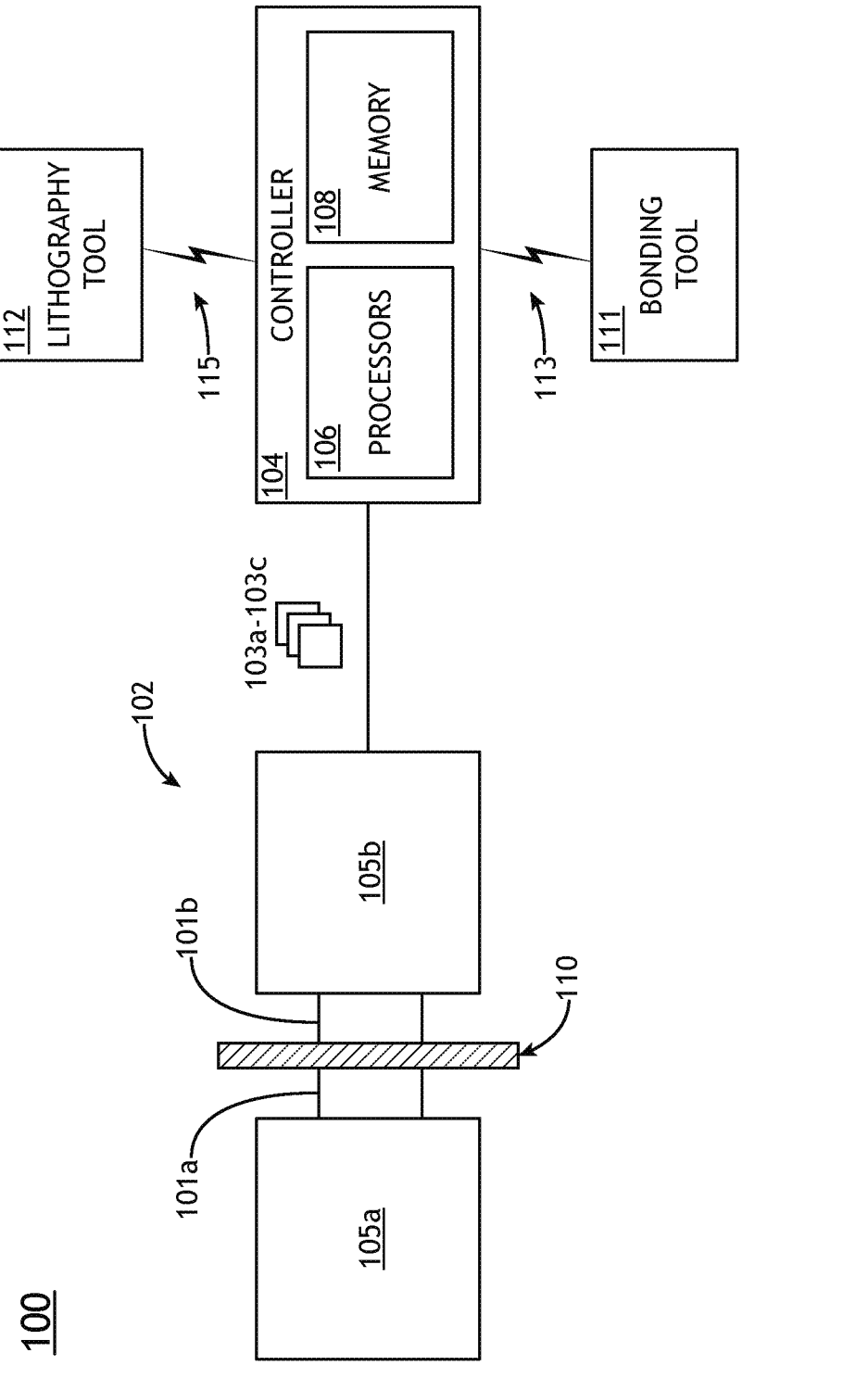
FIG. 1A illustrates a simplified block diagram of a wafer shape metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Referring generally to FIGS. 1A-6, a system and method for optimizing through silicon via (TSV) overlay are illustrated, in accordance with one or more embodiments of the present disclosure.

Embodiments of the present disclosure are directed to a system and method for optimizing Through Silicon Via (TSV) overlay in a buried power rail process. Embodiments of the present disclosure may be implemented to achieve tight overlay requirements in the buried power rail process. The system and method of the present disclosure may include the following components: a wafer shape based overlay metrology solution comprising shape measurements on three wafers (a device and carrier wafer individually as well as the device and carrier wafer bonded together); an algorithm to convert the shape measurements to distortion measurements; and a means to convert the distortion pattern to a CPE correction which may include means to remove the TSV scanner alignment adjustments, which may further include a set of different alignment models (e.g., HOWA1, HOWA3). Also, the system and method may include: additional shape measurements post-grinding as well as pre-TSV lithography; an algorithm to convert the shape changes to overlay distortions; and combining the scaled bonding corrections and the shape contributions in one CPE correction.

In embodiments, the buried power rail process may include an active wafer with functioning logic circuitry and a carrier (electronically passive) wafer which are to be bonded together to form a bonded device wafer. Following the bonding process, the silicon of the device wafer may be thinned down (e.g., to approximately 5 microns). Then, TSV's may be patterned and etched on the backside of the device wafer. These vias may establish an electrical connection between the backside of the thinned silicon and its frontside where the now "buried" FEOL circuitry is located. TSV's allow for the connection from the backside to the front of the wafer, which is done in a classical lithography process. The bonding process as well as the subsequent wafer processing (after thinning) contribute to the distortion patterns that affect the TSV to device overlay. Thus, it is desirable to provide a system and method by which the wafer distortions may be captured and used to generate a scanner correction in a feed forward manner which will minimize the overlay for the TSV lithography exposure. It is further desirable to include a control methodology having: a high resolution, high throughput overlay metrology; the capability of generating required high order corrections before exposure of the wafers at TSV lithography; no requirements of metrology targets on the carrier wafer; and optimized controls available on both the bonder as well as the lithography scanner.

FIG. 1A illustrates a simplified block diagram of a wafer shape metrology system 100, in accordance with one or more embodiments of the present disclosure.

In embodiments, the system 100 is used within a buried power rail process. The system 100 includes a wafer shape metrology sub-system 102. The system 100 may also include a controller 104 communicatively coupled to a detector output of the wafer shape metrology sub-system 102. The controller 104 may include one or more processors 106 and memory 108. The one or more processors 106 of the controller 104 may be configured to execute a set of program instructions stored in memory 108. The set of program instructions may be configured to cause the one or more processors 106 to carry out various steps and processes of the present disclosure.

The wafer shape metrology sub-system 102 may include any wafer geometry tool or system known in the art capable of acquiring one or more shape parameters from one or more wafers. In embodiments, the wafer shape metrology sub-system 102 includes an interferometer sub-system config- ured to perform one or more metrology and/or character- ization processes on one or more wafers. For example, the wafer shape metrology sub-system 102 may include a dual interferometer system (e.g., dual Fizeau interferometer) con- figured to perform measurements on opposite sides of a wafer. For instance, wafer shape metrology sub-system 102 may include a first interferometer sub-system 105*a* config- ured to generate a first illumination beam 101*a* in order to perform one or more measurements on a first surface of the wafer, and a second interferometer sub-system 105*b* con- figured to generate a second illumination beam 101*b* in order to perform one or more measurements on a second surface of the wafer opposite the first surface. The wafer metrology sub-system 102 may include a Patterned Wafer Geometry (PWG) tool such as the PWG tool produced by KLA Inc. The use of interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684, filed on Jan. 15, 2013, which are incorporated herein by reference in their entirety.

It is noted that dual-sided interferometry, such as a PWG tool, may be of particular usefulness for implementation in the context of the processes of the present disclosure. For example, thickness and/or change of thickness information may be input into a machine learning algorithm and/or mechanical model of the present disclosure. Additionally, dual-sided measurements provide flexibility in the event one surface has attributes that makes measurement unreliable. In addition, dual-sided measurements allow for the averaging of shape information from two measurements, improving reliability.

It is noted herein that the scope of the present disclosure is not limited to a dual interferometer system of a PWG implementation and may be extended to encompass any wafer metrology system or tool known in the art including, but not limited to, single-sided interferometer systems.

In embodiments, the wafer shape metrology sub-system 102 is configured to perform wafer shape measurements on wafers while in a stress-free or near stress-free state. For the purposes of the present disclosure, the term "stress-free" should be interpreted to mean a configuration with little force applied to the wafer from external sources. The term "stress-free" may alternatively be interpreted as "free-stand- ing". With external stresses removed, remnant deviations from a flat wafer shape are typically induced through stressed layers present on the front side of the wafer or due to stresses imposed by the bonding process. It is noted that these stresses caused by layers present on the wafers are interpreted as internal stresses. In this sense, 'shape' of a wafer is a combination of 'natural shape' (i.e., bare wafer shape) and the shape caused by internal stresses on either surface of the wafer such as thin-films.

In embodiments, as shown in FIG. 1A, the wafer metrol- ogy sub-system 102 may perform shape measurements on an active wafer, shape measurements on a second wafer, and shape measurements on the post-bonded pair of wafers. It is noted that measurements on the pre-bonded first and second wafers may be used to predict shape of the post-bonded pair of wafers based on a mismatch of the shapes of the first and second wafers and the effect of the bonder and bonding process on the post-bonded pair. In embodiments, the first wafer may include an active wafer with functioning circuitry elements, the second wafer may include a carrier wafer, and the post-bonded pair of wafers may include a bonded device wafer.

In embodiments, the wafer metrology sub-system 102 may perform a first shape measurement on an active wafer 110*a* and then transmit the shape measurement data to the controller 104 via a data signal 103*a*. The wafer metrology sub-system 102 may perform a second shape measurement on a carrier wafer 110*b* and transmit the shape measurement data to the controller 104 via a data signal 103*b*. Then, the active wafer 110*a* and the carrier wafer 110*b* may undergo a bonding process via a bonding device 111 to form a bonded device wafer 110*c*. The wafer metrology sub-system 102 may perform a third shape measurement on the bonded device wafer 110*c* and then transmit the shape measurement data to the controller 104 via data signal 103*c*.

In embodiments, following the bonding process, the con- troller 104 may convert the measured shape information for the active wafer 110*a*, the carrier wafer 110*b*, and the post-bonding wafer pair 110*c* to local shape parameters that characterize local shape characteristics. For example, these parameters may include partial first and second derivatives of the shape or predictions of in-plane displacement using different mechanical models. For instance, the local shape parameters may include, but are not limited to, localized shape curvature (LSC) and/or in-plane distortion (IPD). Additional metrics that have historically been used to predict wafer distortions on a scanner may also be utilized. Such metrics include, but are not limited to, mechanical models to describe the relationship between wafer shape and overlay based on approaches sue as plate theory, finite element method, or proprietary modeling approaches such as the parameters from the Gen3, Gen4, and/or Gen5 models from KLA corporation.

In embodiments, the one or more processors 106 of controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field pro- grammable gate arrays (FPGAs), or one or more digital signal processors (DSPs)). In this sense, the one or more processors 106 may include any device configured to execute algorithms and/or instructions (e.g., program instructions stored in memory).

In additional and/or alternative embodiments, the one or more processors 106 may be embodied as a desktop com- puter, mainframe computer system, workstation, image computer, parallel processor, networked computer, or any other computer system configured to execute a program configured to operate or operate in conjunction with the metrology system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combina- tion of controllers may be separately packaged as a module suitable for integration into metrology system 100. Further, the controller 104 may analyze data received from the wafer metrology sub-system 102 and feed the data to additional components within the metrology system 100 or external to the metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

It is noted herein that the one or more components of the disclosed system 100 may be communicatively coupled to the various other components of the system in any manner known in the art. For example, the wafer metrology sub-system 102, controller 104, and a user interface may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like)).

It is noted that additional or alternative embodiments of determining overlay distortion patterns are described in detail in U.S. patent application Ser. No. 17/161,369, filed on Jan. 28, 2021, which is incorporated herein by reference in the entirety.

Figure 2:
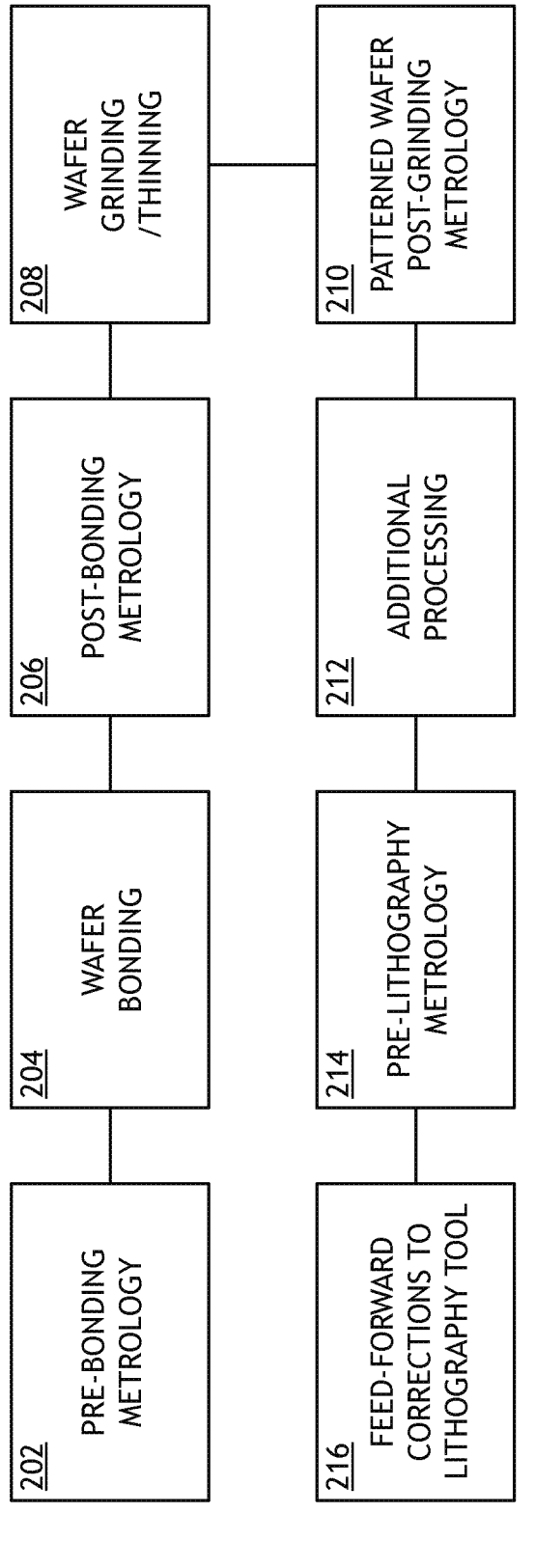
FIG. 2 illustrates a flow diagram depicting a method of converting metrology data into a feed-forward correction for a lithography tool, in accordance with one or more embodiments of the present disclosure.

FIG. 2 illustrates a flow diagram depicting a method of converting metrology data into a feed-forward correction for a lithography tool, in accordance with one or more embodiments of the present disclosure. It is noted herein that the steps of method 200 may be implemented all or in part by wafer metrology system 100. It is further recognized, however, that the method 200 is not limited to the wafer metrology system 100 in that additional or alternative system-level embodiments may carry out all or part of the steps of method 200.

In a step 202, a wafer shape measurement may be performed on the active wafer 110*a* and the carrier wafer 110*b*. For example, as shown in FIG. 1A, the wafer shape sub-system 102 may perform a wafer shape measurement on an active wafer 110*a* or a carrier wafer 110*b* prior to a wafer bonding process.

In a step 204, the active wafer 110*a* and the carrier wafer 110*b* may be bonded to form a bonded device wafer 110*c*. For example, a bonding tool 111 may bond the active wafer 110*a* and the carrier wafer 110*b* in a wafer-to-wafer bonding process. The bonding tool may be configured for hybrid wafer bonding or fusion wafer bonding.

In embodiments, the system 100 may include a buried power rail process. The buried power rail process may include two separate wafers. For example, one of the wafers may include a carrier wafer (e.g., an electronically passive wafer) without device patterns, and the other wafer may include a device wafer (e.g., a wafer having circuitry logic) configured to undergo standard logic patterning. By way of another example, the carrier wafer and the device wafer may be configured to bond face-to-face.

In a step 206, a wafer shape measurement is performed on a bonded device wafer 110*c*. For example, as shown in FIG. 1A, the wafer shape sub-system 102 may perform a wafer shape measurement on the bonded device wafer 110*c* following the bonding process.

In a step 208, a wafer grinding and/or thinning process is performed on a bonded device wafer 110*c*. In embodiments, following the bonding process, one or more process steps may be carried out to remove silicon on the backside of the carrier wafer. For example, a TSV patterning step may be carried out, which consists of patterning the device wafer as well as etching and filling the device wafer to provide electrical connection from the backside to the front side of the device wafer.

In a step 210, a wafer shape measurement is performed on a patterned wafer following the grinding and/or thinning process. For example, as shown in FIG. 1A, the wafer shape sub-system 102 may perform a wafer shape measurement on the wafer following the grinding and/or thinning process.

In a step 212, one or more additional processing steps may be performed on the wafer. For example, the one or more additional processing steps may include one or more deposition steps that potentially contribute to additional distortions of the bonded device wafer 110*c*.

In a step 214, a wafer shape measurement is performed on the wafer following the one or more additional processing steps. For example, the wafer shape measurement may be performed before the TSV lithography process.

In a step 216, one or more feed-forward corrections are provided to a process tool. For example, as shown in FIG. 1A, one or more feedforward control signals 115 may be transmitted to one or more process tools 112 to adjust one or more states of the one or more process tools 112 to minimize/mitigate overlay between the active wafer 110*a* and the carrier wafer 110*b*. For example, the controller 104 may generate one or more feed-forward control signals configured to adjust one or more downstream process tools. Process tools which may be adjusted may include, but are not limited to, a lithography tool, a deposition tool, a polishing tool, an etching tool, a bonder, and the like. For example, such adjustments may include the deposition of backside films to compensate for the shape changes. In this regard, the predicted overlay information may be used to minimize (or at least mitigate) the overlay observed on the bonded device wafer 110*c*.

In embodiments, the controller 104 may be configured to generate one or more feed-forward control signals which may be configured to: generate a distortion pattern as it is seen by the scanner alignment system; simulate the performance of the alignment system based on known parameters such as alignment model and alignment sampling site information; generate a CPE correction, which constitutes as the feed-forward correction, based on residuals of the simulation. In additional and/or alternative embodiments, the one or more feed-forward corrections may be combined with other feed-forward corrections that may include other process corrections applied to the wafer for example a backside film deposition to adjust for significant shape deformations.

In embodiments, the method of FIG. 2 is controlled through the use of 4 PWG shape measurements as well as a post-TSV lithography overlay measurement. For example, the first three measurements performed (i.e., the pre-bonding measurements of the active wafer 110*a* and the carrier wafer 110*b* as well as the post-bonding measurement of the device wafer 110*c*) are used to generate predicted overlay distortion data based on the bonding process. By way of another example, the predicted overlay distortion data, contributed by the bonding process, is expected to affect the TSV overlay. In additional and/or alternative embodiments, two additional shape measurements are done following a grinding/thinning process and prior to a TSV lithography exposure process.

In embodiments, shape changes between the post-grinding PWG measurement and the pre-TSV lithography measurement may contribute to the predicted overlay distortion and TSV overlay. It is noted herein that shape induced overlay variations may be addressed using shape to overlay conversion algorithms (e.g., Gen4 or Gen6 which are shape to overlay conversion algorithms in use by KLA).

In embodiments, the predicted overlay distortion pattern as encountered by the scanner alignment system is generated as a combination of both the bonding contributions (e.g., PWG measurements pre-bonding and post-bonding) as well as the shape contribution.

The 4 PWG measurements may be configured to generate the distortion pattern as seen by the scanner alignment system. For example, a method of combining the pre-bonding and post-bonding shape measurements for generating a misalignment map has been previously described in U.S. patent application Ser. No. 17/161,369, filed on Jan. 28, 2021, which is incorporated herein by reference in the entirety.

In embodiments, the misalignment map may include distortions that have been introduced in both the device wafer as well as the carrier wafer. For example, the distortion pattern of the device wafer is relevant for TSV lithography, which account for the delta allowing for a scaling of the distortion pattern with an adjustable parameter. By way of another example, the adjustable parameter may be determined empirically or through simulations of the mechanical problem (e.g., through finite element situations or the like). Additionally, the distortion may be assessed using a wafer registration measurement (e.g., capabilities of the IPRO7 W system, which is an optical registration measurement tool).

In additional and/or alternative embodiments, the predicted overlay distortion pattern may be analyzed by simulating the alignment performance of the scanner. The purpose of this simulation is to account for the contribution of the scanner alignment system to reduce the effective distortions seen after the exposure. For example, the simulation of the alignment performance may include, but is not limited to, predicting the expected alignment results at the location of the scanner alignment targets; extracting the alignment model parameters for the model used on the lithography scanner (e.g., a high order alignment model, third order (HOWA3)); remove the modeled component from the full wafer overlay data to establish the residual distortions. These distortions are then used to generate the ideal scanner correction. For example, this correction may be a combination of both a high order wafer model and a correction by exposure (CPE) model. These corrections may be calculated on a lot average basis as well as a wafer by wafer basis. These corrections may then be transferred to the scanner for the purpose of applying optimized (i.e., resulting in the lowest residual distortions) exposure corrections.

In alternative embodiments, a feed forward control approach may include collecting pre-bonding shape measurements of wafers 110a,b to adjust the bonder settings. In this case the distortions induced by the bonding process for a given combination of the bonding tool and bonding module are combined with the simulated impact of the incoming wafer shapes on the post bonding results. In the simplest case this combination may be simply a linear addition of the effects of the incoming shape with a static bonder signature. In more complex cases interactions between the incoming shape and the bonder settings need to be accounted for. For example, the bow of the incoming wafers has been found to impact the magnitude of higher order distortions. In either case (differentiated by the complexities of the model) using the bonder modeling control approach described in U.S. patent application Ser. No. 17/589,516, file on Jan. 31, 2022, which is incorporated by reference herein in the entirety, adjustments may be made to the bonder settings to compensate for the predicted impact of the incoming wafer shape.

In another application of the feedforward adjustments, it should be noted that the prediction algorithm may be used to select pairs of wafers for the purpose of achieving optimal post bonding distortion. For example, it should be noted that the shape contributions of the incoming wafers to the post bonding results are minimal if both wafers show similar signatures. It is noted herein that the signature of one of the wafers needs to be flipped to account for the fact that the top wafer is flipped for the bonding relative to the measurement orientation.

FIG. 3 illustrates a flow diagram depicting a method of converting an overlay distortion into a feedforward correction for a lithography tool, in accordance with one or more embodiments of the present disclosure. It is noted herein that the steps of method 300 may be implemented all or in part by wafer metrology system 100. It is further recognized, however, that the method 300 is not limited to the wafer metrology system 100 in that additional or alternative system-level embodiments may carry out all or part of the steps of method 300.

In a step 302, a wafer shape measurement is performed on a first wafer. For example, as shown in FIG. 1A, the wafer shape sub-system 102 may perform a wafer shape measurement on an active wafer 110a prior to a wafer bonding process.

In a step 304, a wafer shape measurement is performed on a second wafer. For example, as shown in FIG. 1A, the wafer shape sub-system 102 may perform a wafer shape measurement on a carrier wafer 110b prior to a wafer bonding process.

In a step 306, the first wafer and the second wafer are bonded to form a bonded device wafer. For example, a bonder 111 may bond the active wafer 110a and the carrier wafer 110b in a wafer-to-wafer bonding process. The bonder 111 may be configured for hybrid wafer bonding or fusion wafer bonding. By way of another example, the bonded device wafer 110c may be configured to function as a device wafer. By way of another example, the device wafer may undergo a grinding and/or thinning process and a TSV patterning and etching process.

In a step 308, a wafer shape measurement is performed on the device wafer. For example, as shown in FIG. 1A, the wafer shape-sub-system 102 may perform a wafer shape measurement on the device wafer following the bonding process.

In a step 310, overlay between features on the first wafer and features on the second wafer are predicted based on the shape measurements from the first wafer, the second wafer, and the bonded pair wafer. In embodiments, the controller 104 may determine or predict overlay between features on the active wafer 110a and features on the carrier wafer 110b based on the shape measurements from the active wafer 110a, the carrier wafer 110b, and the device wafer. For example, the controller 104 may execute an algorithm that correlates shape information from the active wafer 110*a*, the carrier wafer 110*b*, and the device wafer to overlay between features on the active wafer 110*a* and the carrier wafer 110*b*. In a first step, the measured shape information of step 304, 306, and 308 may be converted by controller 104 to local shape parameters that characterize local shape characteristics. Examples of such parameters are localized shape curvature, IPD, and any other shape metrics used in the art to predict wafer distortions.

In a step 310, overlay between features on the first wafer and features on the second wafer are predicted based on the shape measurements from the first wafer, the second wafer, and the bonded pair wafer. In embodiments, the controller 104 may determine or predict deviations of the actual positions of features on the active wafer 110*a* relative to their ideal position based on the shape measurements from the active wafer 110*a*, the carrier wafer 110*b*, and the device wafer. For example, the controller 104 may execute an algorithm that correlates shape information from the active wafer 110*a*, the carrier wafer 110*b*, and the device wafer to overlay between features on the active wafer 110*a* relative to their non distorted position. In a first step, the measured shape information of step 304, 306, and 308 may be converted by controller 104 to local shape parameters that characterize local shape characteristics. Examples of such parameters are localized shape curvature, IPD, and any other shape metrics used in the art to predict wafer distortions.

In a step 312, one or more feedback and or feedforward adjustments are provided to a process tool. For example, as shown in FIG. 1C, one or more control signals 113, 115 may be transmitted to one or more process tools (e.g., bonding tool 111 or lithography tool 112) to minimize/mitigate overlay between the active wafer 110*a* and carrier wafer 110*b* or the relative position of features within the device wafer 110*a*. For example, the controller 104 may generate one or more feedback control signals configured to adjust one or more upstream process tools. In this regard, the predicted overlay information may be used to minimize (or at least mitigate) the overlay observed on future device wafers.

While the focus of the present disclosure has been on the utilization of wafer shape information before and after wafer bonding to provide feed-forward corrections for a lithography tool, additional embodiments of the present disclosure are directed to the simultaneous optimization of control of a bonding tool and lithographic tool. This procedure may be carried out by utilizing a "golden signature".

Figure 4:
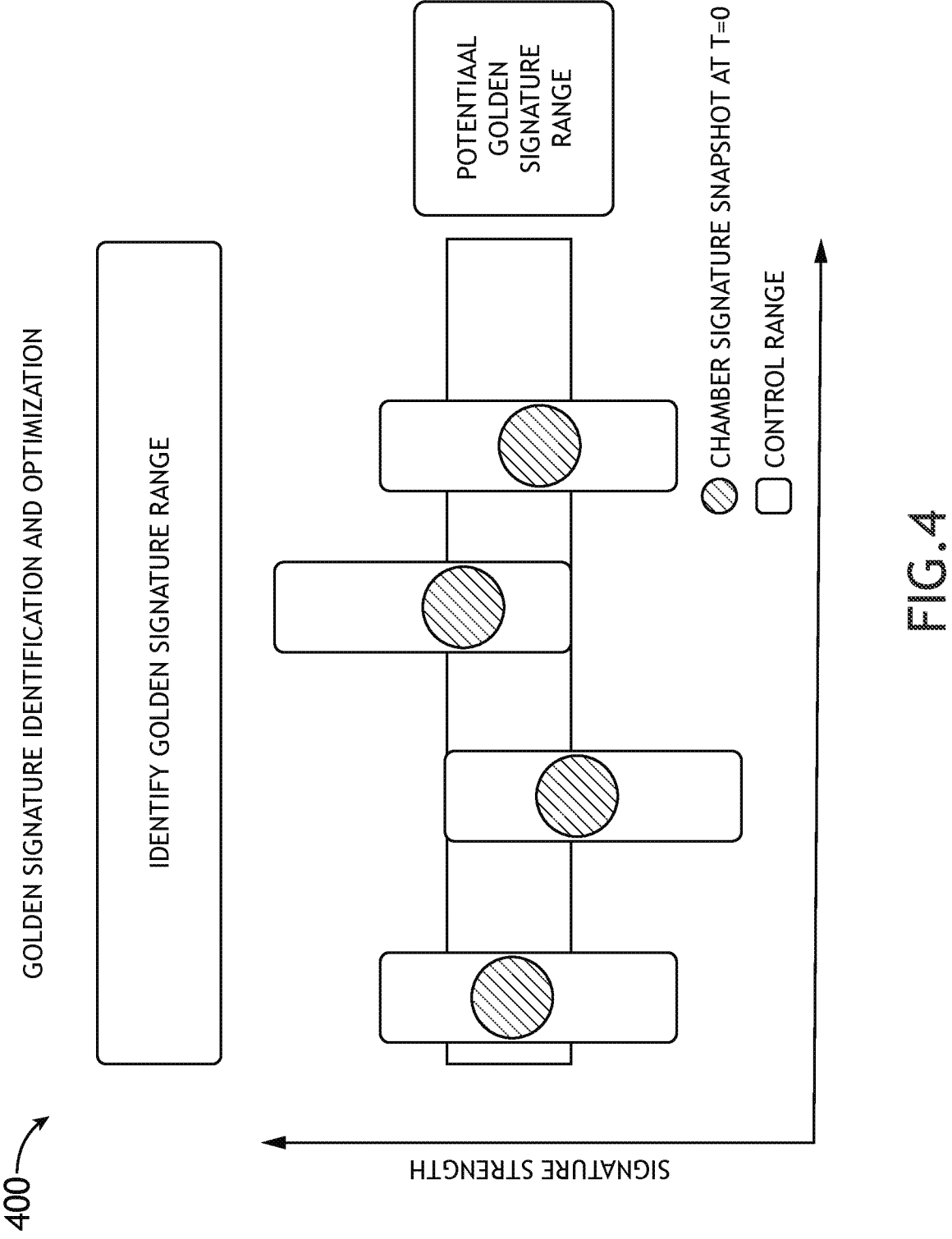
FIG. 4 illustrates a conceptual diagram depicting a potential golden signature range, in accordance with one or more embodiments of the present disclosure.

FIG. 4 illustrates a conceptual diagram depicting a potential golden signature range, in accordance with one or more embodiments of the present disclosure. The conceptual diagram may be configured to detail the simultaneous use of both the control capabilities of the bonder as well as the scanner. The challenge of simultaneous control with two process tools is to optimize the control capabilities of both tools in a typical manufacturing environment where a fleet of bonding tools and a fleet of scanners is used for manufacturing. In one embodiment, the control capabilities of the bonder may be used to achieve a golden signature while the scanner corrections are subsequently tuned to correct the golden signature. Typically, the distortions generated by a specific bonding module do not entirely match to the distortions generated by another bonder module. In the conceptual diagram 400, the individual bonder modules are represented as circles along the x-axis. In the particular example shown, four different bonding modules are being used. In embodiments, each of the tools have a slightly different distortion signature which is represented by different positions along the y-axis. It is to be understood that the bonding tool differences are not one-dimensional parameters, rather, they are differences in the distortion maps. Each of the chambers, starting from the default distortion map, can achieve different vector maps by using the available actuators and the available actuator ranges to modify the signature. In diagram 400 this is represented, in a simplified one-dimensional manner as a range of possible states.

In embodiments, a golden signature may be determined first by identifying the range on the y-axis that is simultaneously achievable by all bonder modules. This is indicated via the "overlap" area (e.g., horizontal bar) of all bonding maps. These are potential candidates for golden signatures. In alternative embodiments, an overlap may not exist, causing the smallest (i.e., larger than zero) bonder chamber to chamber variability to be deemed the "golden signature". For example, the 3-sigma variability of the delta of the distortions may be used. In embodiments, a buried rail process may include two or more process tools (e.g., bonding tool, TSV lithography scanner, or the like) that are configured to adjust which may contribute to the overlay distortion patterns. The two or more process tools may be used in tandem to comprise a combined process control. It is noted herein that the combined process control will be referred to as a "golden signature". For example, the golden signature may include a predicted targeted overlay distortion pattern following a bonding process and may be particularly useful in scenarios where a plurality of bonding tools is matched to a plurality of TSV lithography scanners.

In embodiments, each process tool of the plurality of process tools may include a signature configured to adjust within a specified control range. For example, a signature that is achievable for each process tool of the plurality of process tools may be referred to as a golden signature. By way of another example, a potential golden signature range may be determined when one or more signatures are achievable for each process tool of the plurality of process tools.

In embodiments, the specified control range may include a plurality of achievable signature values for a plurality of process tools. For example, a controller 104 may be configured to use additional optimization criteria to determine a golden signature value from the achievable signature values within the specified control range. By way of another example, the golden signature value may be used to predict one or more overlay distortion patterns. By way of another example, the controller 104 may convert the predicted one or more overlay distortion patterns into a correction for one or more lithography scanners. The correction of the one or more lithography scanners may be used to adjust the plurality of process tools and their corresponding signatures.

Figure 5:
FIG. 5 illustrates a conceptual diagram depicting an optimization of a range of golden signatures, in accordance with one or more embodiments of the present disclosure.

The precise golden signature is then determined by considering other relevant metrics. For example, the best distortion signatures may be decided by evaluating the achievable post-TSV lithography overlay performance while considering the correction capabilities of the scanner. FIG. 5 illustrates a diagram depicting the optimization of a preferred golden signature within a range of potential candidates, in accordance with one or more embodiments of the present disclosure. For example, when there is a range of potential golden signatures, other optimization criteria may be used to identify a preferred golden signature. The example in FIG. 5 illustrates a case where a multitude of golden signatures are available represented by the range of points on the x-axis. In this particular case each one of the golden signatures is further evaluated by the extent to which the subsequent scanner correction can reduce the total variability seen after TSV lithography as shown on the y-axis. As seen in FIG. 5, the best condition is identified as the point with the lowest variability (i.e., the lowest y value). In other embodiments, optimization related to the frequency with which the bonder needs to be shut down for maintenance may be used. For example, the controller 104 may be configured to use a plurality of potential signature values to generate one or more overlay distortion patterns. By way of another example, the controller 104 may be configured to determine an optimal golden signature based on generating one or more overlay distortion patterns and selecting the golden signature value that corresponds to the minimum achievable overlay performance.

FIG. 6 illustrates a flow diagram depicting a method of determining an optimal control signature for a bonding tool or a lithography tool, in accordance with one or more embodiments of the present disclosure. It is noted herein that the steps of method 600 may be implemented all or in part by wafer metrology system 100. It is further recognized, however, that the method 600 is not limited to the wafer metrology system 100 in that additional or alternative system-level embodiments may carry out all or part of the steps of method 600.

In a step 602, a control range is determined for at least one of the plurality of bonding tools and/or the plurality of lithography scanners. The control range of at least one of the plurality of bonding tools and/or the plurality of scanners may include one or more control signatures.

In a step 604, a range of achievable control signatures is identified within the control range for at least one of the plurality of bonding tools and/or the plurality of lithography scanners.

In a step 606, an overlay distortion pattern may be predicted based on the range of achievable control signatures for at least one of the plurality of bonding tools and/or the plurality of lithography scanners.

In a step 608, an optimal control signature is calculated for at least one of the plurality of bonding tools and/or the plurality of lithography scanners. In embodiments, an optimal control signature may be identified based on a minimal achievable overlay for at least one of the plurality of bonding tools or the plurality of lithography scanners.

In a step 610, a feedback correction may be provided to at least one of the plurality of bonding tools or the plurality of lithography scanners based on the calculated optimal control signatures.

Sofar we have discussed the case were a matching distortion pattern between different bonders/bonder tools is achievable. In the scenario where such a condition is not available other approaches my need to be deployed. For example the adjustment capabilities of the bonder may be used to stabilize the post bonding distortion with respect to tool drift or incoming wafer variations (as outlined above). In this case the litho adjustments will be controlled depending on the information of the bonder tool that was used to process the pair. It then becomes context information that uses bonder tool dependent threads for determining scanner corrections.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the noninclusion of specific components, operations, devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B".

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A wafer shape metrology system comprising:
a wafer shape metrology sub-system configured to perform one or more stress-free shape measurements on a first wafer, a second wafer, and a bonded device wafer, wherein the bonded device wafer comprises a post-bonding pair of the first wafer and the second wafer; and
a controller communicatively coupled to the wafer shape metrology sub-system, the controller including one or more processors configured to execute a set of program instructions stored in a memory, the set of program instructions configured to cause the one or more processors to:
receive the one or more stress-free shape measurements from the wafer shape sub-system;
determine overlay distortion between one or more features on the first wafer and one or more features on the second wafer based on the one or more stress-free shape measurements of the first wafer, the second wafer, and the bonded device wafer; and
convert the overlay distortion to a feedforward correction for one or more lithographic scanners.

2. The system of claim 1, wherein the first wafer is an active wafer including functioning logic circuitry and the second wafer is an electrically passive carrier wafer.

3. The system of claim 1, wherein the device wafer undergoes a thinning process.

4. The system of claim 3, wherein a set of through silicon vias (TSVs) are patterned and etched on the backside of the device wafer.

5. The system of claim 4, wherein the set of TSVs comprise one or more contacts configured to provide an electrical connection from a back side of the device wafer to the front side of the device wafer.

6. The system of claim 1, wherein the converting the overlay signature to a feedforward correction for one or more lithographic scanners comprises:
converting the overlay signature to a feedforward correction for one or more lithographic scanners to reduce overlay for one or more lithographic exposures in a TSV process.

7. The system of claim 6, wherein the converting the overlay signature to a feedforward correction for one or more lithographic scanners includes one or more scaled bonding adjustments.

8. The system of claim 6, wherein the wafer shape metrology sub-system is configured to perform one or more additional shape measurements on the device wafer following a grinding process and prior to the TSV process.

9. A system comprising:

a controller configured to receive one or more stress-free shape measurements from a wafer shape metrology sub-system, wherein the controller includes one or more processors configured to execute a set of program instructions stored in a memory, wherein the set of program instructions are configured to cause the one or more processors to:

receive the one or more stress-free shape measurements from the wafer shape sub-system;

determine overlay distortion between one or more features on the first wafer and one or more features on the second wafer based on the one or more stress-free shape measurements of the first wafer, the second wafer, and the bonded device wafer; and convert the overlay distortion to a feedforward correction for one or more lithographic scanners.

10. The system of claim 9, wherein the first wafer is an active wafer including functioning logic circuitry and the second wafer is an electrically passive carrier wafer.

11. The system of claim 9, wherein the device wafer undergoes a thinning process.

12. The system of claim 11, wherein a set of through silicon vias (TSVs) are patterned and etched on the backside of the device wafer.

13. The system of claim 11, wherein the set of TSVs comprise one or more contacts configured to provide an electrical connection from a back side of the device wafer to the front side of the device wafer.

14. The system of claim 9, wherein the converting the overlay signature to a feedforward correction for one or more lithographic scanners comprises:

converting the overlay signature to a feedforward correction for one or more lithographic scanners to reduce overlay for one or more lithographic exposures in a TSV process.

15. The system of claim 14, wherein the converting the overlay signature to a feedforward correction for one or more lithographic scanners includes one or more scaled bonding adjustments.

16. The system of claim 14, wherein the wafer shape metrology sub-system is configured to perform one or more additional shape measurements on the device wafer following a grinding process and prior to the TSV process.

* * * * *